United States Patent
Andre

(10) Patent No.: US 9,257,165 B2
(45) Date of Patent: Feb. 9, 2016

(54) ASSISTED LOCAL SOURCE LINE

(71) Applicant: Everspin Technologies, Inc., Chandler, AZ (US)

(72) Inventor: Thomas Andre, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 14/495,123

(22) Filed: Sep. 24, 2014

(65) Prior Publication Data

US 2015/0255133 A1 Sep. 10, 2015

Related U.S. Application Data

(60) Provisional application No. 61/950,501, filed on Mar. 10, 2014.

(51) Int. Cl.
*G11C 11/16* (2006.01)

(52) U.S. Cl.
CPC .................................... *G11C 11/16* (2013.01)

(58) Field of Classification Search
CPC ........................................................ G11C 11/16
See application file for complete search history.

(56) References Cited

U.S. PATENT DOCUMENTS

| 8,792,269 | B1 | 7/2014 | Abedifard et al. | |
| 2011/0267874 | A1* | 11/2011 | Ryu et al. | G11C 11/16 365/158 |

* cited by examiner

*Primary Examiner* — Harry W Byrne
*Assistant Examiner* — Ajay Ojha
(74) *Attorney, Agent, or Firm* — Lee & Hayes, PLLC

(57) ABSTRACT

In some examples, a memory device has a memory array configured to include sets of bit cells grouped based in part on an arrangement of local source lines. Each of the groups of cells may include an assist bit having a lower impedance than the other bit cells of the group to cause current distributed by the local source lines to be largely provided to the assist bit. In some examples, the assist bit include a shorted tunnel junction and in other examples, multiple assist bits may be connected by one or more bridge assisted bit lines.

20 Claims, 11 Drawing Sheets

ASSISTED LOCAL SOURCE LINE

RELATED APPLICATION

This application claims priority to U.S. Provisional Application No. 61/950,501 to Andre et al., entitled "Pipelined MRAM Architectures and Circuits and Methods of Manufacturing and Operating Same," filed Mar. 10, 2014, the contents of which are incorporated herein by reference in their entirety.

BACKGROUND

In some magnetic memory devices, such as magnetic random access memories (MRAMs), the energy consumption rate may be higher than comparable non-magnetic memory devices, such as dynamic random access memories (DRAMs).

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
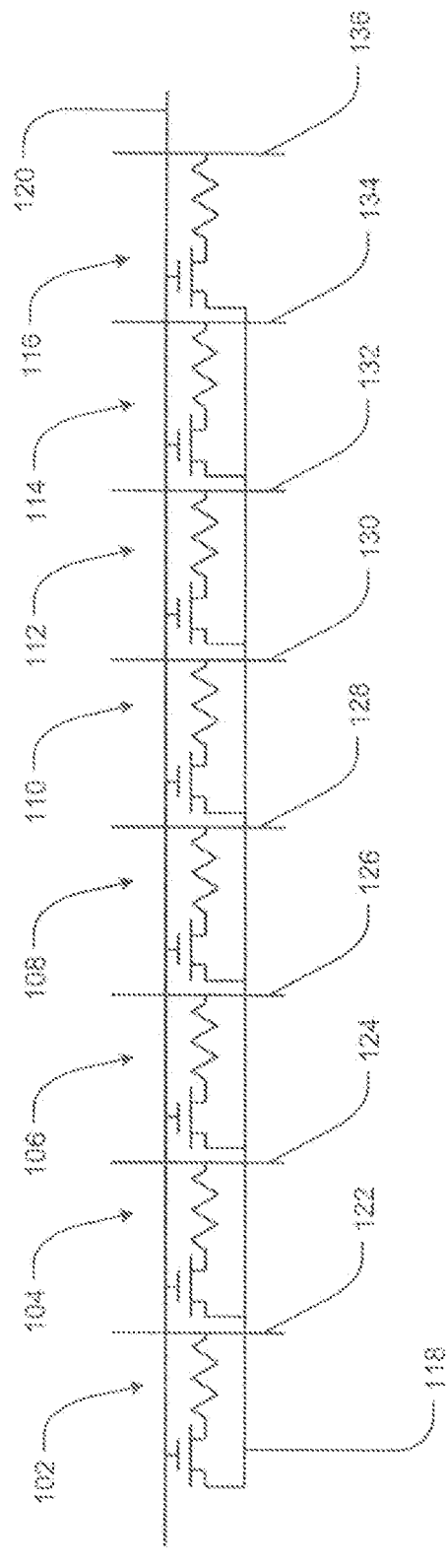
FIG. 1 illustrates an example diagram of a group of memory cells associated with a memory array of a memory device and having a shared local source line according to some implementations.

This disclosure includes, in part, techniques and implementations to improve the reliability of memory devices. For example, this disclosure includes improved systems and methods for ensuring proper setting of memory cells in memory devices incorporating shared local source lines between multiple memory cells. For example, in some implementations, groups of memory cells or bit cells may share a word line and/or a local source line. For instance, a group of eight bits may be configured to share a local source line, such that when a selected bit associated with the group is switched, a bit line associated with the selected bit may have a voltage applied causing current to flow between the word line and the local source line through the selected bit. In this implementation, the current driven over the bit line may be distributed by the local source line to each of the remaining bits associated with the group, thereby preventing a voltage that is sufficient to switch a bit from being applied to any of the remaining bits.

In some cases, the current being distributed between the remaining bits associated with the group may still cause one or more of the other bits to be set or switched. For example, in the group having eight bits, one seventh of the current being used to set the selected bit is passed through each of the remaining bits. If this fraction of the current is sufficient to disturb the value stored on the remaining bits, an error may still occur. In these cases, additional bits may be introduced into the group in order to further distribute the current across the additional bits and the remaining bits. However, in some implementations, it may be desirable to reduce the number of bits associated with a local source line. For instance, in implementations in which power consumption of the overall memory device is a concern, reducing the number of bits associated with each local source line may reduce the overall power consumption of the memory device. That is, each bit added to a local source line may increase the power consumption associated with accessing data stored in the memory device.

In some implementations, one or more additional columns may be introduced or connected to the local source line to drain at least a portion of the current that is being distributed between the unselected bits. For example, an additional bit cell, e.g., a bit line assist cell, may be introduced and shorted by, for example, introducing an overvoltage during testing of the memory device. The assist bit or shorted bit may act as a low impedance path to draw a larger than proportional fraction of the current away from the other bits associated with the local source line. This may reduce the likelihood of disturbing the unselected or remaining bits. In some particular examples, the low impedance path associated with the assist bit may be introduced by applying high voltages to a tunnel junction associated with the assist bit to cause the tunnel junction to breakdown.

In other implementations, an assist bit associated with a first group or first local source line and a second assist bit associated with a second group or second local source line may be connected by a bridge assisted bit line. By connecting the two assist bits by a bridge assisted bit line, both assist bits experience lower impedance, thus causing additional fractions of the current applied across the bit line of the selected bit to be distributed to the assist bits. For example, the assist bits may be associated with a column within the memory array, and the tunnel junction of the assist bit in adjacent rows may be bridged. In other examples, multiple groups each having a local source line may be configured or arranged such that more than two assist bits may be connected via a secondary bridge assisted bit line. By connecting the additional assist bits via the secondary bridge assisted bit line the impedance is further reduced along the path associated with the each of the assist bits. For instance, the assist bits may be arranged as multiple columns of the memory array and the secondary bridge assisted bit line may be arranged between rows of the memory array. In this manner, the tunnel junctions associated with each assist bit in the rows adjacent to the secondary bridge assisted bit line may be connected.

FIG. 1 illustrates an example diagram of a group of memory cells 100 associated with a memory array of a memory device according to some implementations. In the example illustrated in FIG. 1, the group of memory cells 100 includes eight bit cells, e.g., a first bit cell 102, a second bit cell 104, a third bit cell 106, a fourth bit cell 108, a fifth bit cell 110, a sixth bit cell 112, a seventh bit cell 114, and an eight bit cell 116. In the illustrated example, each of the eight bits cells 102-116 are connected to a shared local source line 118 and a word line 120.

Each of the bit cells 102-116 are associated with a corresponding bit line. For example, the first bit cell 102 is associated with a first bit line 122, the second bit cell 104 is associated with a second bit line 124, the third bit cell 106 is associated with a third bit line 126, the fourth bit cell 108 is associated with a fourth bit line 128, the fifth bit cell 110 is associated with a fifth bit line 130, the sixth bit cell 112 is associated with a sixth bit line 132, the seventh bit cell 114 is associated with a seventh bit line 134, and the eighth bit cell 116 is associated with an eighth bit line 136. In general, the bit lines 122-136 are configured to drive a current over the bit cells 102-116 associated with the shared local source line 118 in order to set or switch at least one of the bit cells 102-116. In some cases, the shared local source line 118 may be used within the memory device to reduce the overall size of the memory device and/or the energy consumption associated with the memory device, as in some implementations, the shared local source line 118 may replace a global source line.

In general, each of the bit cells 102-116 is configured to store a single bit of data. In some examples, the bit cells 102-116 may include a tunnel junction or a magnetic tunnel junction (MTJ) arranged between two metal layers associated with the memory device and/or the memory array. In some cases, the value stored on each of the bit cells 102-116 may be switched in a first direction (i.e., from zero to a one) by applying positive voltage between the corresponding bit line 122-136 and the remaining bit lines 122-136. Alternatively, the bit cells 102-116 may be switched in a second direction (i.e., from one to a zero) by applying negative voltage between the corresponding bit line 122-136 and the remaining bit lines 122-136. In some particular types of memory devices (e.g., magnetic random access memories), the bits cells 102-116 may be switched in order to read the data stored within the memory arrays.

When a particular bit cell 102-116 of the group of memory cells 100 connected to the shared local source line 118 is switched or set, positive voltage or negative voltage may be driven over a particular one of the bit lines 122-136 corresponding to the particular bit cell related to the remaining bit lines. For example, assuming that the eighth bit cell 116 is being switched or set, a high voltage may be driven on the eighth bit line 136, while the other bit lines 122-134 are driven low to cause the value of the eighth bit cell 116 to change either from a zero to a one or from a one to a zero. In other examples, the value of the eighth bit cell 116 may be switched by driving the eighth bit line 136 low, while a high voltage is maintained on the other bit lines 122-134. However, since the bit cells 102-116 share a local source line 118, a fraction of the current applied to the eighth bit line 136 may be distributed to each of the remaining bit cells 102-114. As long as the fraction of the current distributed to each of the remaining bit cells 102-114 remains below the threshold that would disturb or interrupt the bit cells 102-114, the other bit cells 102-114 are able to maintain the stored value. Thus, in some implementations, the number of bit cells 102-116 associated with a local source line 118 may depend in part on the particular current that is required to flip, set, or switch each of the bit cells 102-116 of the memory arrays within the memory device.

In some cases, the current may be distributed evenly between the remaining bit cells 102-114, as described above, while in other cases, the current distributed to each of the remaining bit cells 102-114 may depend on the present state, resistance, or value stored in each of the remaining bit cells 102-114. For instance, if the first bit cell 102 is low (e.g., storing a value of 0) and the second-seventh bit cells 104-114 are high (e.g., storing a value of 1) a larger fraction of the current may be distributed over the first bit cell 102 than over each of the second-seventh bit cells 104-114, as the impedance associated with first bit cell 102 in the low state may be less than the impedance of the second-seventh bit cells 104-114 in the high state, in some implementations. Thus, in some cases, adding additional bit cells to the group of memory cells 100 connected to the shared local source line 118 may still result in a memory device in which one or more of the non-active bit cells may be disturbed and error may be introduced. Therefore, other implementations for distributing the current on the local source line 118 are described below with respect to FIGS. 2-4.

Figure 2:
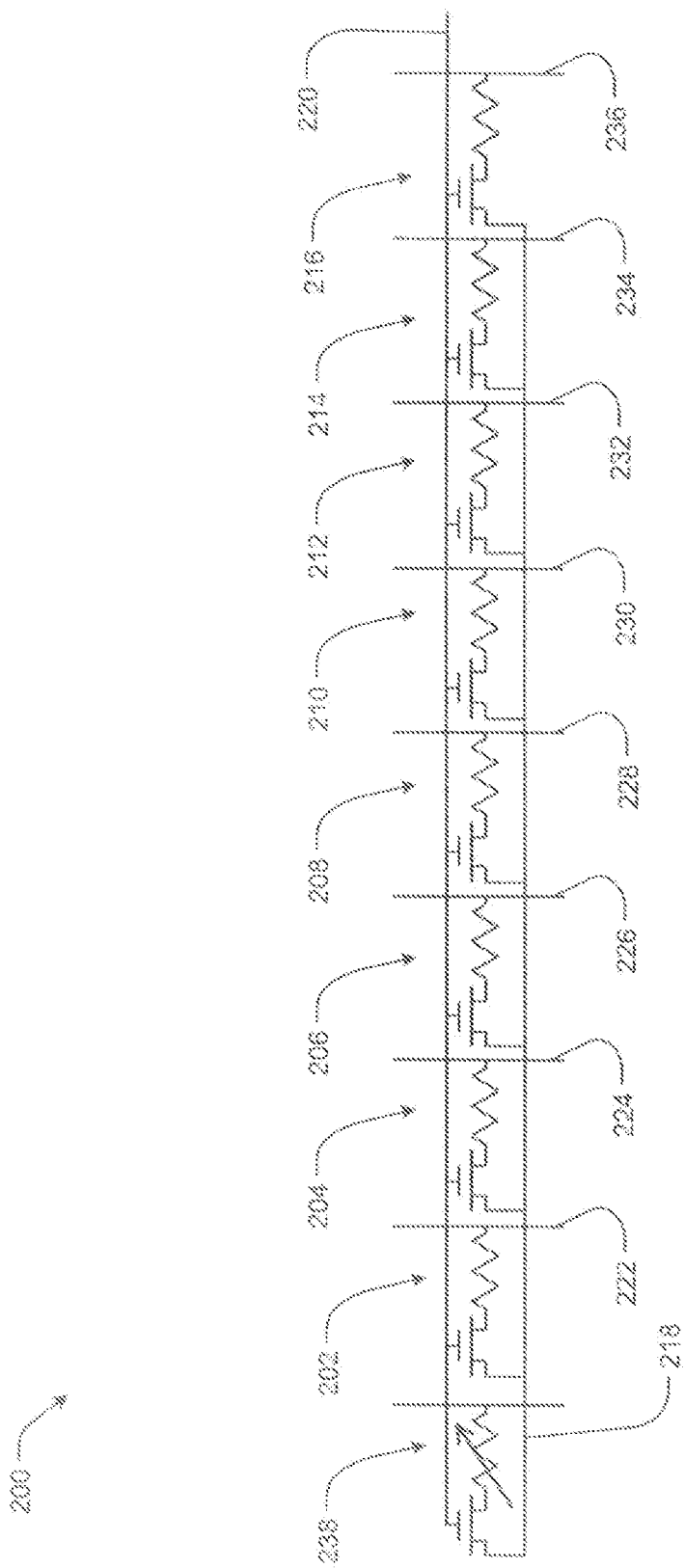
FIG. 2 illustrates another example diagram of a group of memory cells associated with a memory array of a memory device and having a shared local source line according to some implementations.

FIG. 2 illustrates another example diagram of a group of memory cells 200 associated with a memory array of a memory device according to some implementations. As illustrated in FIG. 2, the group of memory cells 200 includes eight bit cells. For example, as illustrated, the group 200 includes a first bit cell 202, a second bit cell 204, a third bit cell 206, a fourth bit cell 208, a fifth bit cell 210, a sixth bit cell 212, a seventh bit cell 214, and an eighth bit cell 216 connected to a shared local source line 218.

In the illustrated example, each of the eight bit cells 202-216 also share a word line 220 and are associated with a corresponding bit line. For example, the first bit line 202 is associated with a first bit line 222, the second bit line 204 is associated with a second bit line 224, the third bit line 206 is associated with a third bit line 226, the fourth bit line 208 is associated with a fourth bit line 228, the fifth bit line 210 is associated with a fifth bit line 230, the sixth bit line 212 is associated with a sixth bit line 232, the seventh bit line 214 is associated with a seventh bit line 234, and the eighth bit line 216 is associated with an eighth bit line 236. In general, the bit lines 222-236 are configured to drive a voltage across the shared local source line 218 and the associated bit cells 202-216 in order to set or switch the associated bit cell 202-216. In the illustrated example, the group of bit cells 200 also includes an assist bit, generally indicated by reference number 238 (e.g., a shorted or low impedance cell).

In general, the assist bit 238 is introduced into the group 200, to provide a lower impedance path for the voltage applied across the any of the eight bit lines 222-236 in order to reduce the risk of disturbance to one or more of the non-active bit cells 202-216. In some examples, the assist bit 238 may be one or more bit cells having a shorted tunnel junction or MTJ. In other examples, the assist bit 238 may be a cell or circuitry other than a memory cell or bit cell. In one particular example, the assist bit 238 may be created or generated during testing of the memory device. For instance, during testing or another pre-sale procedure, an overvoltage may be applied across the tunnel junction associated with the assist bit 238 to cause the tunnel junction to short, fuse, or close such that a large fraction of the voltage being applied over the active bit line is directed over the shared local source line 218 to the assist bit 238. Thus, in this particular implementation, the fraction of the voltage distributed between the bit cells 202-216 is reduced, thereby reducing the risk of disturbing the value stored in each of the bit cells 202-216.

In one particular example, assuming that the eighth bit cell 216 is being switched or set, a high voltage may be driven over the eighth bit line 236, while the other bit lines 222-234 are driven low to cause the value of the eighth bit cell 216 to change. In this example, since the eight bit cells 202-216 are connected to the shared local source line 218, a fraction of the current applied to the eighth bit line 232 may be distributed to each of the remaining bit cells 202-214. As discussed above, as long as the fraction of the current distributed to each of the remaining bit cells 202-214 remains below a voltage threshold that would disturb or interrupt the first-seventh bit cells 202-214, the memory device may operate free of errors.

In this example, a large fraction or portion of the current applied to the eighth bit line 232 is directed to the assist bit 238 and a fraction of the remaining current (e.g., the voltage not directed to the assist bit 238) is distributed between the other seven bit cells 202-214. Thus, by introducing the assist bit 238 the fraction of the current distributed to any one of the other seven bit cells 202-214 is further reduced, thereby reducing the risk of disturbing the non-active bit cells 202-214 associated with the shared local source line 218 and the risk of introducing an error into the data stored on the memory device.

In the illustrated example, the assist bit 238 is a single cell or column associated with the group 200. However, it should be understood, in other implementations, two or more cells or columns may be associated with a low impedance bit, thereby providing additional low impedance paths for the voltage applied over the active bit line. For instance, for each additional low impedance bit associated with the group 200, the fraction of the current applied to the non-active bit cells 202-214 may be further reduced, potentially improving the overall reliability of the memory device.

Figure 3:
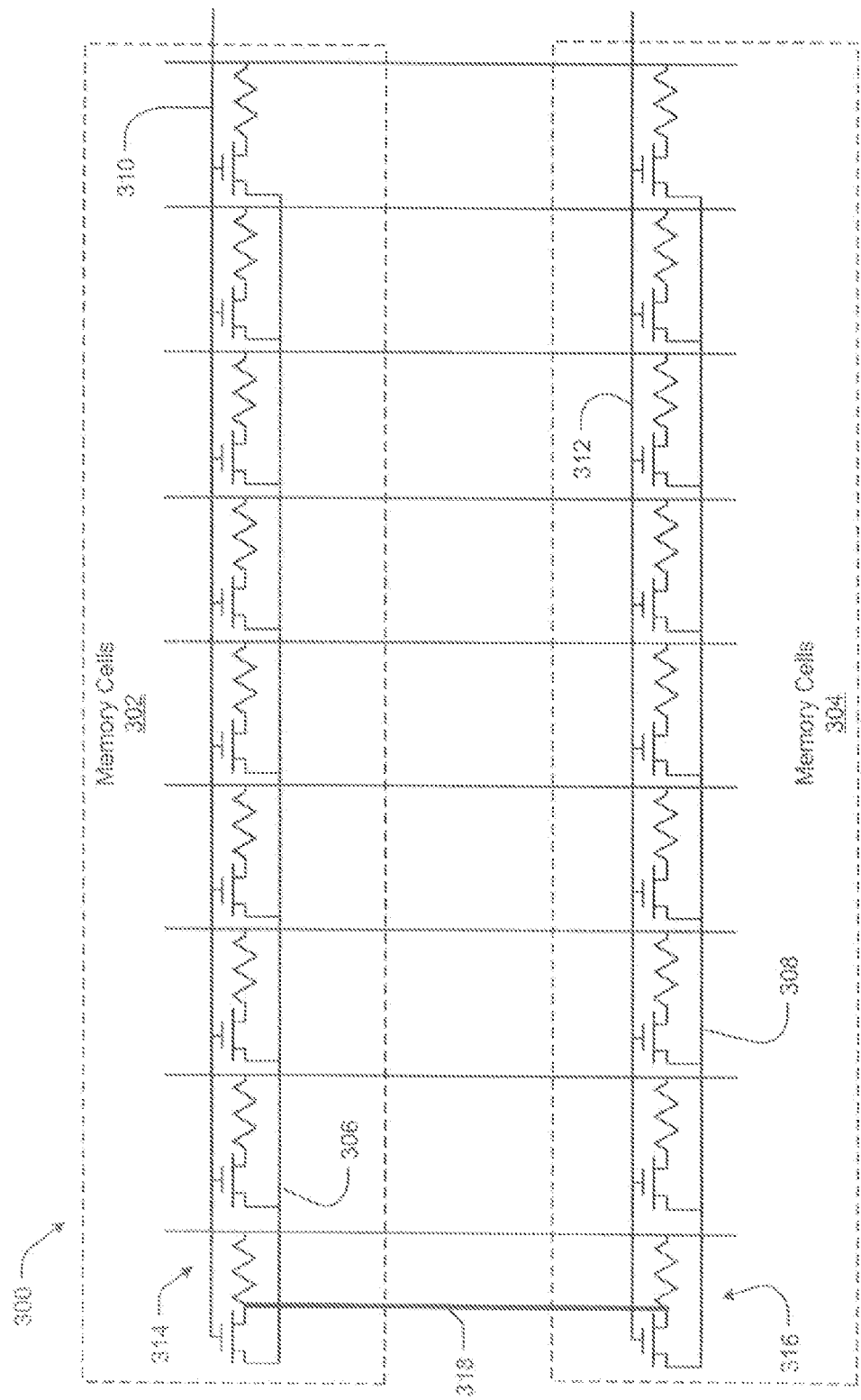
FIG. 3 illustrates select components of a memory array associated with a memory device having multiple groups of memory cells each having a local source line according to some implementations.

FIG. 2 provides one example implementation of reducing the current applied to the non-active bit cells 202-214 by introducing one or more low impedance bits into the group of memory cells 200 sharing the local source line 218. FIG. 3 provides another example implementation to further improve the reliability of a memory device having memory arrays with groups of memory cells sharing a local source line.

FIG. 3 illustrates select components of a memory array 300 associated with a memory device having multiple groups of memory cells 302 and 304 each having a local source line 306 and 308 according to some implementations. In the illustrated example, the first group of memory cells 302 includes a group of bit cells connected to the shared local source line 306 and a word line 310, while the second group of memory cells 304 includes another group of bit cells connected to the shared local source line 308 and a word line 312.

As described above with respect to FIG. 2, the first group of memory cells 302 connected to the shared local source line 306 include an assist bit 314, and the second group of memory cells 304 connected to the shared local source line 308 includes an assist bit 316. As discussed above, the assist bit 314 may provide a lower impedance path for the current distributed by the shared local source line 306 and the assist bit 316 may provide a lower impedance path for the current distributed by the shared local source line 308. In some examples, the assist bits 314 and 316 may be one or more bit cells having a shorted tunnel junction or MTJ. For example, a tunnel junction associated with each of the assist bits 314 and 316 may be shorted by applying an overvoltage during testing of the memory array 300.

In some implementations, the memory array 300 may be configured to activate either the word line 310 or word line 312 at one time. In these implementations, the tunnel junction portion of the assist bits 314 and 316 may be bridged together by bridge assisted bit line path 318. By bridging the tunnel junctions of the assist bit 314 with the tunnel junction of the assist bit 316, the resistance associated with the assist bits 314 and 316 may be further reduced, thus, causing larger fractions of the current associated with the shared local source lines 306 and 308 to be distributed to the assist bits 314 and 316.

In the illustrated example, the tunnel junction of the assist bits 314 or 316 are bridged to reduce the resistance and lower the impedance associated with assist bits 314 or 316. However, it should be understood that in other implementations additional tunnel junctions associated with additional low impedance bits may be bridged to further reduce the impedance. For instance, FIG. 4 below shows one implementation in which four groups of cells each having their own local source line may be connected to reduce the series resistance on each of the assist bits associated with the bridge assisted bit line.

Figure 4:
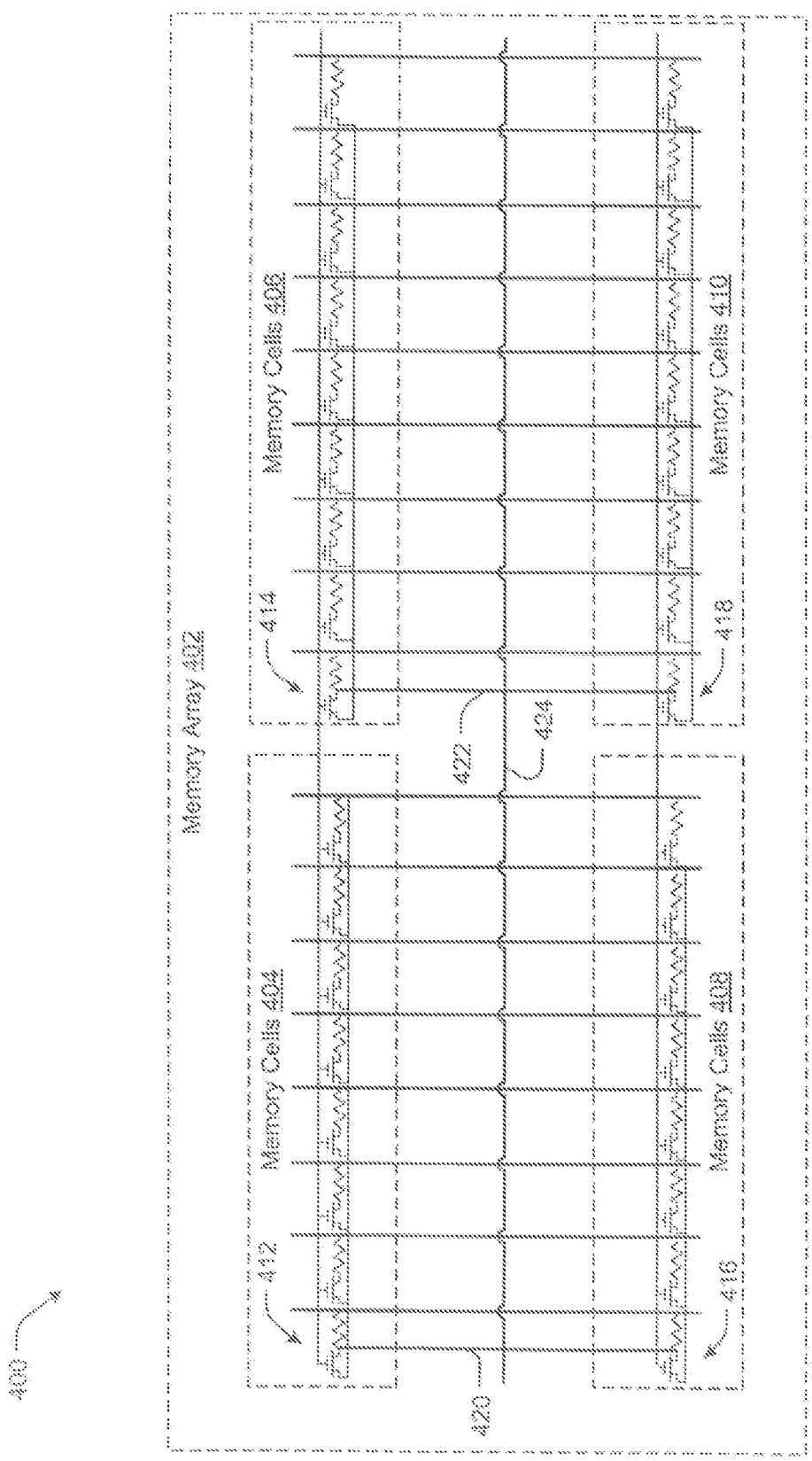
FIG. 4 illustrates select components of a memory device having multiple groups of memory cells each having a local source line according to some implementations.

FIG. 4 illustrates select components of a memory device 400 having a memory array 402 including multiple groups of memory cells 404, 406, 408, and 410 each having a local source line according to some implementations. In the illustrated example, each of the groups 404-410 includes eight bit cells and an assist bit. For example, group 404 includes assist bit 412, group 406 includes assist bit 414, group 408 includes assist bit 416, and group 410 includes assist bit 418.

In some examples, the assist bits 412-418 may be bit cells connected together via a bridged assist bit line, as described above with respect to FIG. 3. For instance, in the illustrated example, a tunnel junction associated with the assist bit cell 412 is bridged or connected to a tunnel junction associated with the assist bit cell 416 via bridge assisted bit line 420 and a tunnel junction associated with the assist bit cell 414 is bridged or connected to a tunnel junction associated with the assist bit cell 418 via bridge assisted bit line 422. By bridging the tunnel junctions in this manner, the assist bits 412 and 416 form a pair of assist bits reducing the overall impedance associated with both assist bits 412 and 416. Likewise, the assist bits 414 and 418 form a pair when connected by the bridge assisted bit line 422.

In some examples, in addition to bridging the tunnel junctions, the tunnel junction associated with each of the assist bit cells 412-418 may be shorted by applying a high voltage or overdrive during testing. For instance, the assist bits 412-418 may be arranged in columns (e.g., bit cells 412 and 416 or bit cells 414 and 418) within the memory array 402, such that during testing an overvoltage may be applied to the column assigned to the low impedance or assist bits to break down or short the tunnel junction associated with each of the bit cells within the selected column.

In the illustrated example, in addition to bridging the assist bit cell pair 412 and 416 and the pair 414 and 418, each of the bridge assisted bit lines (e.g., bridge assisted bit lines 420 and 422) may be connected, for instance, via an additional bridge assisted bit line or path, generally indicated by reference number 424. By connecting or bridging additional assist bit cells (e.g., 412-418) together, the impedance associated with each of the assist bit cells 412-418 may be further reduced. This may cause greater fractions or portions of the current applied to any one of the local source lines to be distributed to the assist bits 412-418, thereby improving the reliability of the memory device 400. In the illustrated example, the assist bit cells are arranged as columns within a memory array 402 and the additional bridge assisted bit line 424 is arranged between the rows of bit cells. However, in other examples, the assist bit cells may be arranged in rows, and the additional bridge assisted bit line 424 may be arranged between the columns of the memory array 402.

Figure 5:
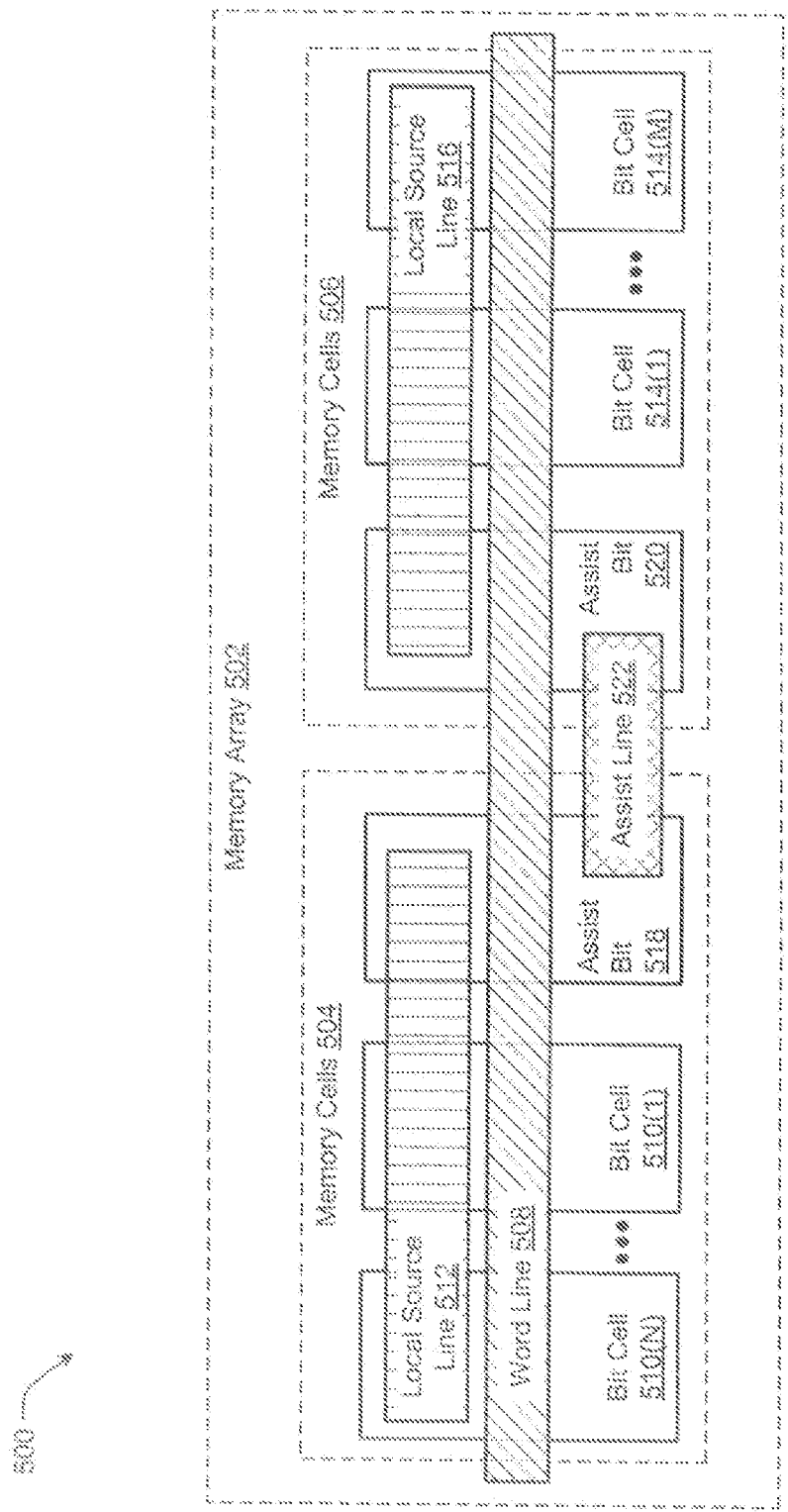
FIG. 5 illustrates an example layout of select portions of a memory array having two groups of memory cells each sharing a local source line and including an assist bit connected via a bridge assisted bit line according to some implementations.

FIG. 5 illustrates an example layout 500 of select portions of a memory array 502 having two groups of memory cells 504 and 506 along a common word line 508 according to some implementations. The first group of memory cells 504 includes bit cells 510(1)-(N) and a local source line 512, and the second group of memory cells 506 includes bit cells 514(1)-(M) and a local source line 516. In the illustrated example, the first group 504 includes an assist bit 518 connected to an assist bit 520 of the second group 506 by a bridge assisted bit line 522, as described above with respect to FIG. 3.

In some examples, the assist bits 518 and 520 may be bit cells that are bridged or connected via the bridged assist bit line 522 to place the bit cells in parallel and to generate a low impedance bit or path associated with the respective local source lines 512 and 516. In other examples, the assist bits 518 and 520 may include circuitry other than a memory cell or bit cell, for instance, a low impedance resistor or a low voltage capacitor. In one particular example, the assist bits 518 and 520 may be a bit cell having a shorted tunnel junction or MTJ. For instance, during testing or another pre-sale procedure an overvoltage may be applied across the tunnel junction associated with the assist bits 518 and 520 to cause the tunnel junction to short, fuse, or close to create a low impedance bit along each of the respective local source lines 512 and 516.

In the illustrated example, the memory array 502 may be configured such that either group 504 or 506 may be activated. For instance, group 504 may be activated by driving a voltage on a bit line associated with a bit cell 510(1). In this instance, the voltage is applied over the bit line associated with bit cell 510(1) may cause a value stored by the bit cell 510(1) to switch (e.g., from a value of zero to one or from a value of one to a zero depending on the current state of the bit cell 510(1) and if a positive or negative voltage is being driven). The current applied may be distributed to the other bit cells 510(2)-(M) of the first group 504 via the local source line 512. However, a larger than proportional fraction of the current is distributed to the assist bit 518, since the assist bit 518 is arranged in parallel with the assist bit 520 via the bridge assisted bit line 522. In other words, the impedance associated with the assist bit 518 is lower than an impedance associated with each of the bit cells 510(2)-(M), which causes a larger portion of the current to dissipate through the assist bit 518 rather than being distributed to the bit cells 510(2)-(M).

In the illustrated example, the tunnel junctions of two assist bits 518 and 520 associated with the same word line 508 are connected by the bridge assisted bit line 522. However, in other examples, more than two assist bits may be connected or bridged to further reduce the series resistance and the impedance associated with each of the bridged assist bits. Alternatively, in other examples, the tunnel junctions of assist bits associated with different word lines may be bridged or connected, as described below with respect to FIG. 6.

Figure 6:
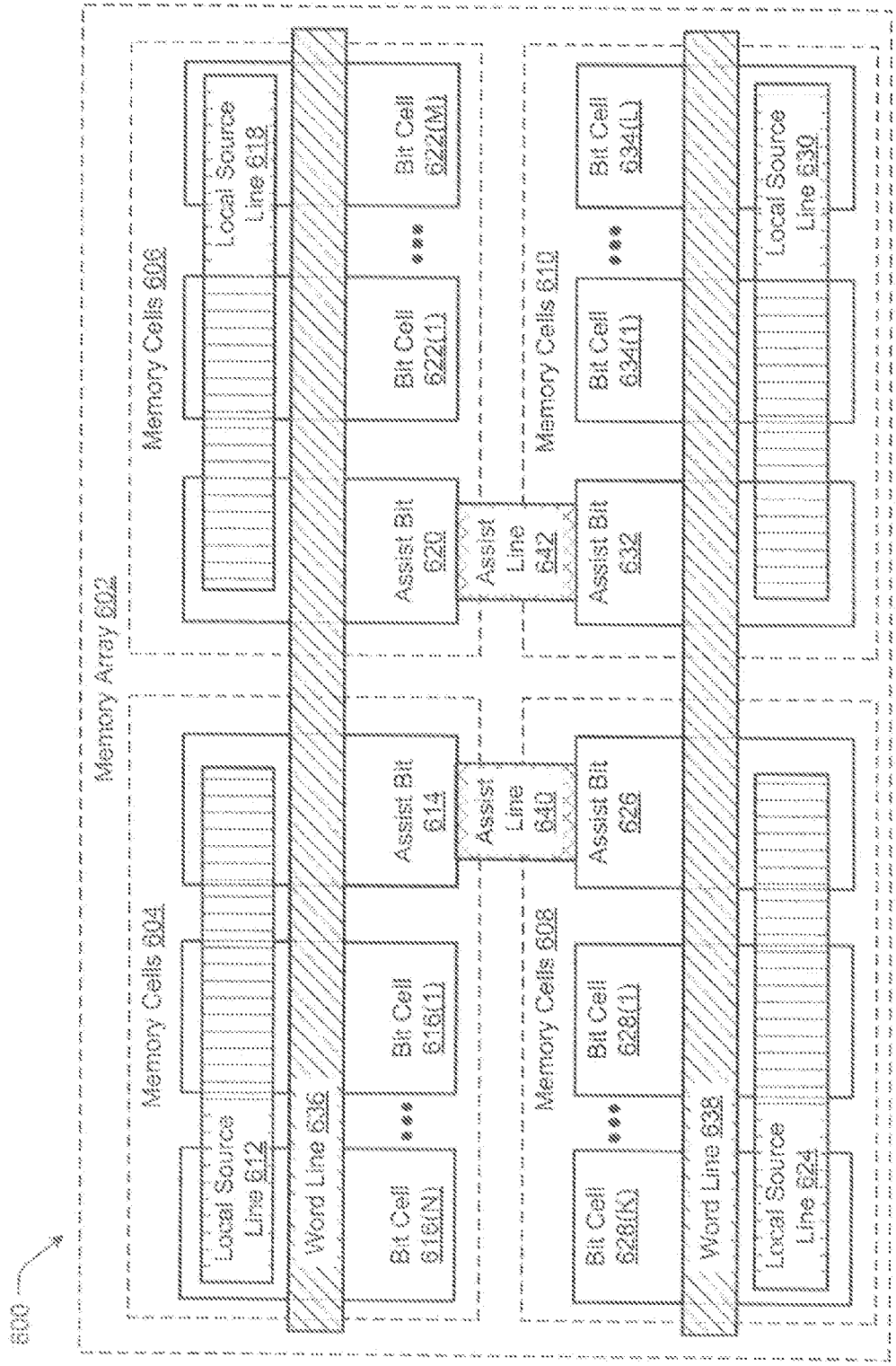
FIG. 6 illustrates another example layout of select portions of a memory array having groups of memory cells each sharing a local source line and including assist bits connected by a bridge assisted bit line according to some implementations.

FIG. 6 illustrates another example layout 600 of select portions of a memory array 602 having groups of memory cells 604, 606, 608, and 610 each sharing a local source line and including an assist bit according to some implementations. For example, the group of memory cells 604 includes a local source line 612, an assist bit 614, as well as bit cells 616(1)-(N). The group of memory cells 606 includes a local source line 618, an assist bit 620, as well as bit cells 622(1)-(M). The group of memory cells 608 includes a local source line 624, an assist bit 626, as well as bit cells 628(1)-(K). The group of memory cells 610 includes a local source line 630, an assist bit 632, as well as bit cells 634(1)-(L).

In general, the bit cells 616(1)-(N), 622(1)-(M), 628(1)-(K), and 634(1)-(L) associated with the memory array 602 may be configured to store a single bit of data. In some examples, each of the bit cells 616(1)-(N), 622(1)-(M), 628(1)-(K), and 634(1)-(L) may include a tunnel junction or an MTJ arranged between two of the metal layers associated with the memory device and/or the memory array 602. In some cases, the value stored in each of the bit cells 616(1)-(N), 622(1)-(M), 628(1)-(K), and 634(1)-(L) may be switched in a first direction (i.e., from one to zero) by applying positive voltage across the corresponding bit line arranged along a column of bit cells associated with the memory array 602 and in a second direction (i.e., from zero to one) by applying a negative voltage across the corresponding bit line.

In some examples, the assist bits 614, 620, 626, and 632 may be bit cells having a tunnel junction or MTJ, while in other examples the assists bits 614, 620, 626, and 632 may include additional or alternative circuitry for providing a low impedance path for current distributed over respective local source lines 612, 618, 624, and 630. In one particular example, the assist bits 614, 620, 626, and 632 may be bit cells having a shorted tunnel junction or MTJ. For instance, during testing an overvoltage may be applied across a bit line associated with the assist bit columns of the memory array 602 to short, fuse, or close the tunnel junction of each bit resulting in a bit having a lower impedance than the other bits of the memory array 602.

In the illustrated example, the two groups of memory cells 604 and 606 are arranged as part of a first row of bit cells within the memory array 602 and share a first word line 636, while the two groups of memory cells 608 and 610 are arranged as part of a second row of bit cells within the memory array 602 and share a second word line 638. In some implementations, the memory device associated with the memory array 602 may be configured to activate only one word line within the memory array 602 at one time (e.g., either the first word line 636 or the second word line 638). In these implementations, the assist bits 614 and/or 620 associated with the first word line 636 may be connected or bridged with the assist bits 626 and/or 632 associated with the second word line 638. For instance, in the illustrated example, the assist bit 614 associated with the group 604 having shared local source line 612 is connected to assist bit 626 associated with the group 608 having shared local source line 624 by bridge assisted bit line 640. The assist bit 620 associated with the group 606 having shared local source line 618 is connected to assist bit 632 associated with the group 610 having shared local source line 630 by bridge assisted bit line 642.

By bridging assist bits along a designated assist column, as illustrated, the bridge assisted bit lines, such as bridge assisted lines 640 and 642, may be generated without interfering with the other circuitry and metal layers associated with the memory array 602. For example, assist bits associated with pairs of word lines may be generated by adding the metal associated with the bridge assisted bit lines between every other row along the assist columns within the memory array 602.

Figure 7:
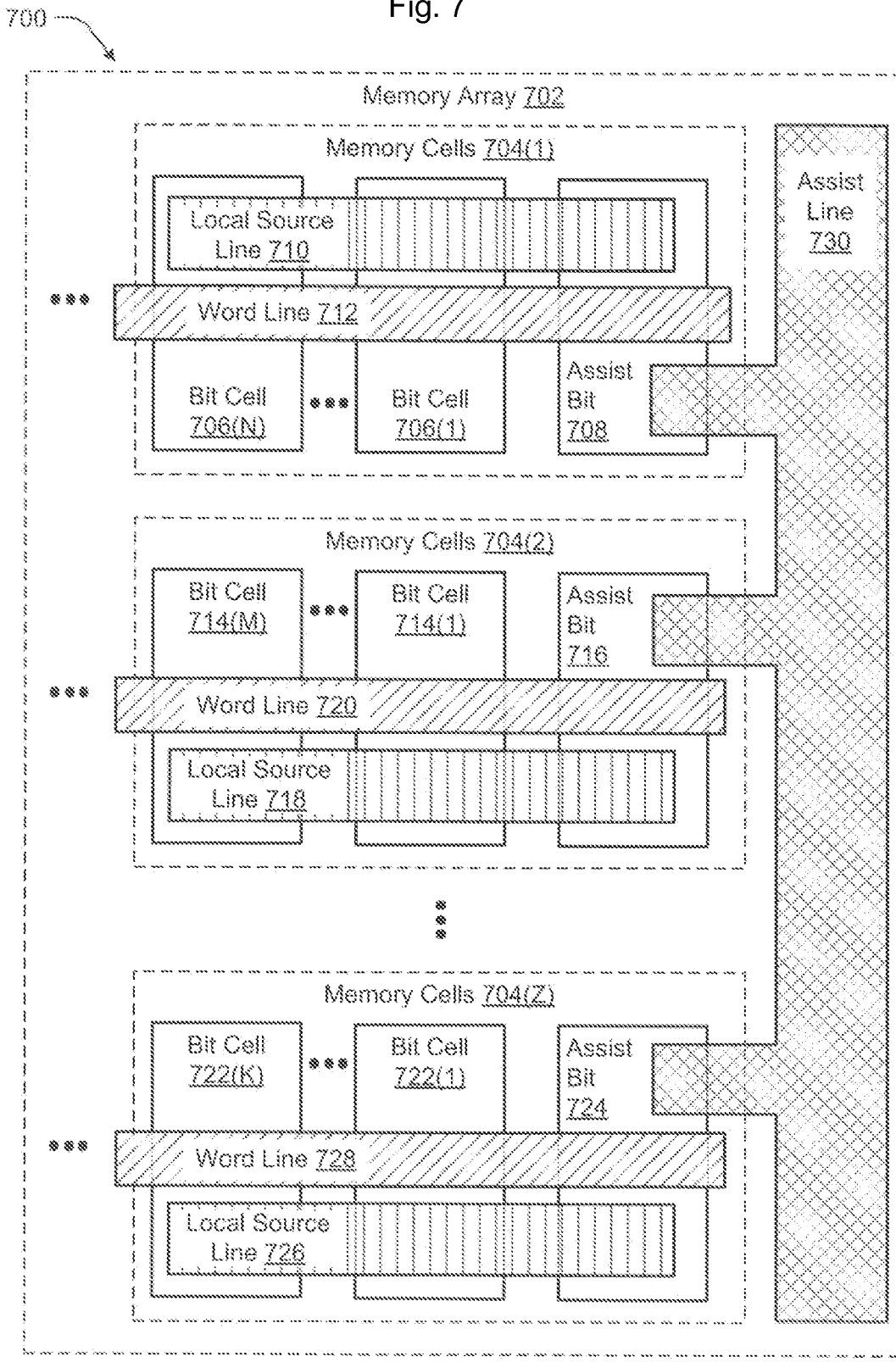
FIG. 7 illustrates an example layout of select portions of a memory array having groups of memory cells each sharing a local source line and including an assist bit connected to a bridge assisted bit line according to some implementations.
Figure 8:
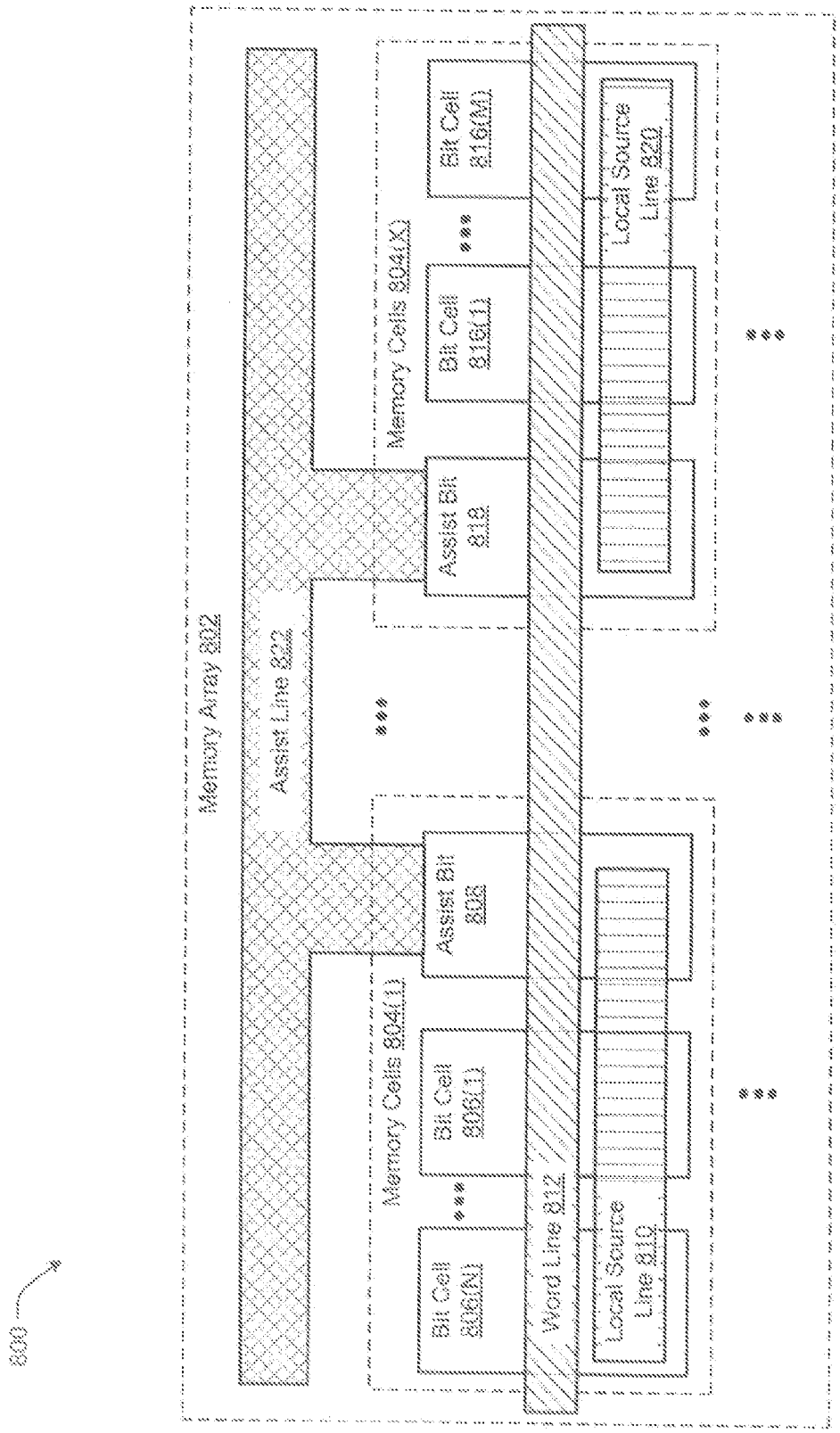
FIG. 8 illustrates another example layout of select portions of a memory array having groups of memory cells each sharing a local source line and including an assist bit connected to a bridge assisted bit line according to some implementations.

FIGS. 5 and 6 illustrate examples of layouts in which pairs of assist bits are bridged together to generate lower impedance paths along the local source lines associated with each group of bit cells. However, in other implementations, additional assist bits may be connected together to further reduce the impedance associated with each of the assist bits. FIGS. 7 and 8 below provide two example layouts in which multiple assist bits are connected via a bridge assisted bit line.

FIG. 7 illustrates an example layout 700 of select portions a memory array 702 having groups of memory cells 704(1)-(Z) each sharing a local source line and including an assist bit connected to a bridge assisted bit line according to some implementations. For instance, in the illustrated example, bit cells 706(1)-(N) and an assist bit 708 are associated with the first group of memory cells 704(1) and share a local source line 710 and a word line 712. Bit cells 714(1)-(M) and an assist bit 716 are associated with the second group of memory cells 704(2) and share a local source line 718 and a word line 720. Bit cells 722(1)-(K) and an assist bit 724 are associated with another group of memory cells 704(Z) and share a local source line 726 and a word line 728.

As discussed above, the bit cells 706(1)-(N), 714(1)-(M), and 722(1)-(K) associated with the memory array 702 may each be configured to store a single bit of data (e.g., a value of zero or one). In some examples, each of the bit cells 706(1)-(N), 714(1)-(M), and 722(1)-(K) may include a tunnel junction or an MTJ arranged between two of the metal layers associated with the memory device and/or the memory array 702. In some cases, the value stored in each of the bit cells 706(1)-(N), 714(1)-(M), and 722(1)-(K) may be switched in a first direction (i.e., from zero to one) by applying positive voltage over the corresponding bit line arranged along a column of bit cells associated with the memory array 702 (for example, column (1) of the memory array 702 includes bit cells 706(1), 714(1), and 722(1)). The value stored in each of the bit cells 706(1)-(N), 714(1)-(M), and 722(1)-(K) may also be switched in a second direction (i.e., from one to zero) by applying negative voltage over the corresponding bit line.

In some examples, the assist bits 708, 716, and 724 may be bit cells having a tunnel junction or MTJ, while in other examples the assists bits 708, 716, and 724 may include additional or alternative circuitry for providing a low impedance path for voltage distributed over the respective local source lines 710, 718, and 726. In one particular example, the assist bits 708, 716, and 724 may be a bit cell having a shorted tunnel junction or MTJ. For instance, during testing an overvoltage may be applied across a bit line associated with the assist bit columns of the memory array 702 to short, fuse, or close the tunnel junction of each bit resulting in a bit having a lower impedance than the other bits of the memory array 702.

In the illustrated layout 700, each of the groups of memory cells 704(1)-(Z) are arranged as part of an individual row of bit cells within the memory array 702. Each of the groups 704(1)-(Z) may include the bit cells associated with particular columns (e.g., columns (1)-(N)), for example, if the groups each contained eight bit cells, each group may include one bit cell associated with the columns 1-8. In this example, each of the assist bits 708, 716, and 724 (e.g., the bit associated with column (0)) may be connected via a bridge assisted bit line 730 to reduce the overall impedance associated with the bits of column (0) or the assist bits 708, 716, and 724 and to direct a larger than proportional fraction of the current applied over the respective local source lines 710, 718, and 726 to the assist bits 708, 716, and 724.

FIG. 7 provides one example layout 700 for bridging multiple assist bits arranged in a column within the memory array 702 together to reduce the impedance associated with each of the assist bits 708, 716, and 724. FIG. 8 provides an alternative layout 800 for bridging multiple assist bits arranged in a row within the memory array together to reduce the impedance associated with each of the assist bits.

FIG. 8 illustrates another example layout 800 of select portions a memory array 802 having groups of memory cells 804(1)-(X) each sharing a local source line and including an assist bit connected to a bridge assisted bit line according to some implementations. For instance, in the illustrated example, bit cells 806(1)-(N) and an assist bit 808 are associated with the first group of memory cells 804(1) and are connected to a shared local source line 810 and a word line 812 and bit cells 816(1)-(M) and an assist bit 818 are associated with another group of memory cells 804(X) and are connected to a shared local source line 820 and the word line 812.

As discussed above, the bit cells 806(1)-(N) and 816(1)-(M) associated with the memory array 802 may each be configured to store a single bit of data (e.g., a value of zero or one). In some examples, each of the bit cells 806(1)-(N) and 816(1)-(M) may include a tunnel junction or an MTJ arranged between two of the metal layers associated with the memory device and/or the memory array 802. In some cases, the value stored in each of the bit cells 806(1)-(N) and 816(1)-(M) may be switched in a first direction (i.e., from zero to one) by applying positive voltage across the corresponding bit line arranged along a column of bit cells associated with the memory array 802. The value stored in each of the bit cells 806(1)-(N) and 816(1)-(M) may also be switched in a second direction (i.e., from one to zero) by applying negative voltage across the corresponding bit line.

In some examples, the assist bits 808 and 818 may be bit cells having a tunnel junction or MTJ, while in other examples the assists bits 808 and 818 may include additional or alternative circuitry for providing a low impedance path for voltage distributed over the respective local source lines 810 and 820. In one particular example, the assist bits 808 and 818 may be bit cells having a shorted tunnel junction or MTJ. For instance, during testing an overvoltage may be applied across a bit line associated with the assist bit columns of the memory array 802 to short, fuse, or close the tunnel junction of each bit resulting in a bit having a lower impedance than the other bits of the memory array 802.

In the illustrated layout 800, each of the groups of memory cells 804(1)-(X) are arranged as part of one row of bit cells within the memory array 802. In this example, each of the assist bits 808 and 818 may be connected via a bridge assisted bit line 822 arranged to run between each of the rows associated with the memory array 802. By bridging the assist bits 808 and 818 along a particular row of bit cells of the memory array 802, the overall impedance associated with the assist bits 808 and 818 may be reduced and a larger than proportional faction of the current applied to the respective local source lines 810 and 820 may be distributed to the assist bits 808 and 818 when one of the other bit cells 806(1)-(N) and 816(1)-(M) are switched, thereby reducing the error rate of the memory array 802.

Figure 9:
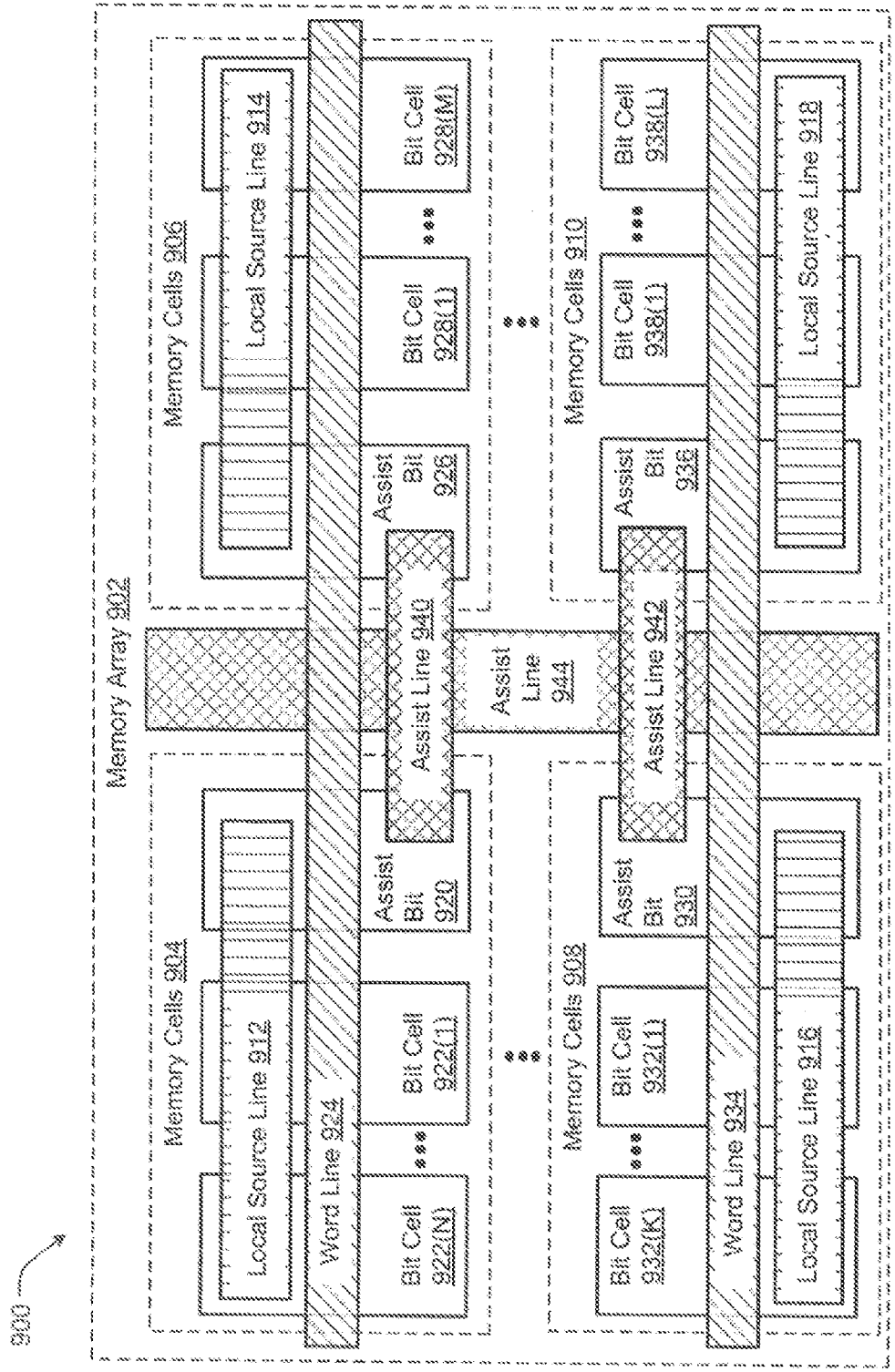
FIG. 9 illustrates another example layout of select portions of a memory array having groups of memory cells each sharing a local source line and including an assist bit connected to a bridge assisted bit line according to some implementations.
Figure 10:
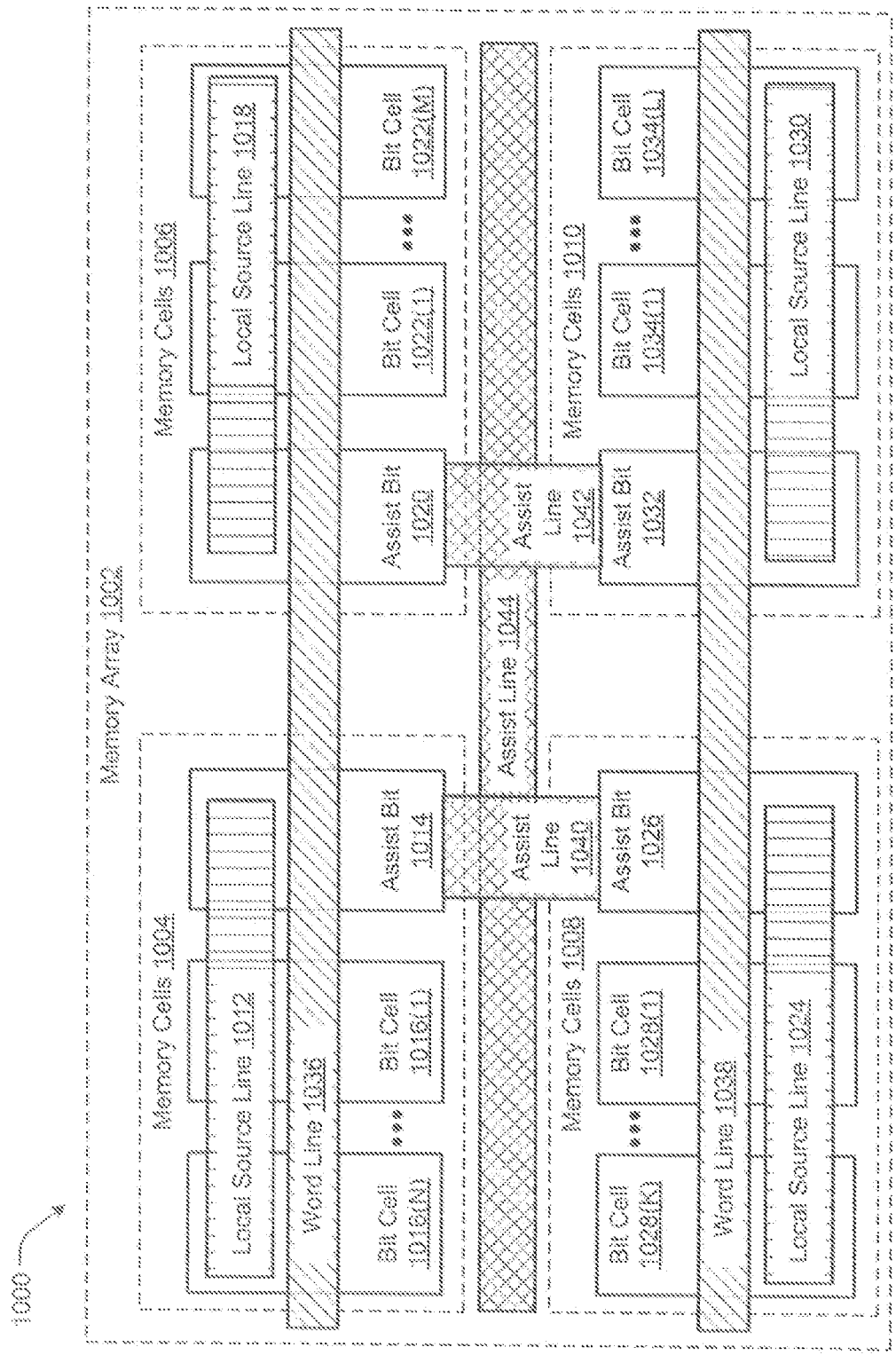
FIG. 10 illustrates another example layout of select portions of a memory array having groups of memory cells each sharing a local source line and including an assist bit connected to a bridge assisted bit line according to some implementations.

FIGS. 7 and 8 provide example layouts 700 and 800 in which assist bits associated with individual columns or rows of a memory array may be bridged via a bridge assisted bit line to reduce overall impedance and to improve the error rates associated with particular memory arrays. FIGS. 9 and 10 provide additional example layouts in which assist bits associated with both rows and columns of a memory array may be bridged to further reduce the series resistance and thereby reduce the impedance associated with each of the assist bits of the memory arrays.

FIG. 9 illustrates another example layout 900 of select portions of a memory array 902 having groups of memory cells 904, 906, 908, and 910 each having an associated local source line 912, 914, 916, and 918 according to some implementations. In some implementations, the first group of memory cells 904 includes an assist bit 920 and bit cells 922(1)-(N) associated with the local source line 912 and a word line 924. The second group of memory cells 906 includes an assist bit 926 and bit cells 928(1)-(M) associated with the local source line 914 and the word line 924. Likewise, the third group of memory cells 908 includes an assist bit 930 and bit cells 932(1)-(K) associated with the local source line 916 and a word line 934, and the fourth group of memory cells 910 includes an assist bit 936 and bit cells 938(1)-(L) associated with the local source line 918 and the word line 934.

In the illustrated layout 900, the assist bits 920, 926, 930, and 936 associated with the respective groups of bit cells 922(1)-(N), 928(1)-(M), 932(1)-(K), and 938(1)-(L) are arranged in pairs, as described above with respect to FIG. 5. For example, the impedance associated with the assist bit 920 and the assist bit 926 may be reduced in part by connecting the assist bit 920 and the assist bit 926 via a bridge assisted bit line 940. Further, the impedance associated with the assist bit 930 and the assist bit 936 may be reduced in part by connecting the assist bit 930 and the assist bit 936 via a bridge assisted bit line 942. Thus, the groups of memory cells (e.g., groups 904, 906, 908, and 910) include at least one assist bit (e.g., assist bits 920, 926, 930, and 936) having a reduced impedance and configured to receive a larger fractional portion of any current distributed along the local source lines (e.g., local source lines 912-918).

As discussed above, in addition to reducing the impedance of the assist bits 920, 926, 930, and 936 by connecting the assist bits 920, 926, 930, and 936 in pairs via the bridge assisted bit lines 940 and 942, the assist bits 920, 926, 930, and 936 may include a shorted tunnel junction or MTJ to further reduce the impedance associated with each of the assist bits 920, 926, 930, and 936. For instance, in some examples, during testing an overvoltage may be applied across a bit line associated with the assist bit columns of the memory array 902 to short, fuse, or close the tunnel junction of each bit resulting in a bit having a lower impedance than the other bits of the memory array 902.

In the illustrated example, each pair of assist bits (e.g., a first pair of assist bits 920 and 926 connected by the bridge assisted bit line 940, as well as a second pair of assist bits 930 and 936 connected by the bridge assisted bit line 942) are also connected to each other via a bridge assisted bit line 944 to further reduce the series resistance of the assist bits 920, 926, 930, and 936 and thereby, further reducing the impedance associated with each of the assist bits 920, 926, 930, and 936. In the illustrated example, pairs of assist bits (e.g., assist bits 920 and 926 connected by the bridge assisted bit line 940, as well as assist bits 930 and 936 connected by the bridge assisted bit line 942) may be formed within rows of the memory array 902 by arranging assist bit columns of two memory cell groups adjacent each other.

The pairs of assist bits (e.g., assist bits 920 and 926 connected by the bridge assisted bit line 940, as well as assist bits 930 and 936 connected by the bridge assisted bit line 942) may be connected by arranging the bridge assisted bit line 944 between the two columns associated with the pairs of assist bits. Therefore, in some implementations, the number of assist bits bridged by the bridge assisted bit lines may equal twice the number of rows within the memory array 902. This may result in assist bits that have a lower impedance than the other bit cells of the memory array 902 regardless of the value stored in the bit cell.

FIG. 10 illustrates yet another example layout 1000 of select portions a memory array 1002 having groups of memory cells 1004, 1006, 1008, and 1010 each having an associated local source line 1012, 1018, 1024, and 1030 according to some implementations. In some implementations, the group of memory cells 1004 also includes an assist bit 1014 and bit cells 1016(1)-(N) associated with the local source line 1012 and a word line 1036 and the group of memory cells 1006 includes an assist bit 1020 and bit cells 1022(1)-(M) associated with the local source line 1018 and the word line 1036. Likewise, the group of memory cells 1008 also includes an assist bit 1026 and bit cells 1028(1)-(K) associated with the local source line 1024 and a word line 1038 and the group of memory cells 1010 includes an assist bit 1032 and bit cells 1034(1)-(L) associated with the local source line 1030 and the word line 1038.

In the illustrated layout 1000, the assist bits 1020, 1026, 1030, and 1036 associated with the respective groups of bit cells 1022(1)-(N), 1028(1)-(M), 1032(1)-(K), and 1038(1)-(L) are arranged in pairs, as described above with respect to FIG. 6. For example, the impedance associated with the assist bit 1020 and the assist bit 1030 may be reduced in part by connecting the assist bit 1020 an the assist bit 1030 via a local bridge assisted bit line 1040 and the impedance associated with the assist bit 1026 and the assist bit 1036 may be reduced in part by connecting the assist bit 1026 an the assist bit 1036 via a local bridge assisted bit line 1042. Thus, the groups of memory cells (e.g., 1004, 1006, 1008, and 1010) include at least one assist bit (e.g., 1020, 1026, 1030, and 1036) having a reduce impedance and configured to receive a larger factional portion of any current distributed along the local source lines (e.g., 1012-1018).

As discussed above, in addition to reducing the impedance of the assist bits 1014, 1020, 1026, and 1032 by connecting the assist bits 1014, 1020, 1026, and 1032 in pairs via the local bridge assisted bit lines 1040 and 1042, the assist bits 1014, 1020, 1026, and 1032 may include a shorted tunnel junction or MTJ to further reduce the impedance associated with each of the assist bits 1014, 1020, 1026, and 1032. For instance, in some example, during testing or an overvoltage may be applied across a bit line associated with the assist bit columns of the memory array 1002 to short, fuse, or close the tunnel junction of each bit resulting in a bit having a lower impedance than the other bits of the memory array 1002.

In the illustrated example, each pair of assist bits (e.g., 1014 and 1026 connected by local bridge assisted bit line 1040, as well as 1020 and 1032 connected by bridge assisted bit line 1042) are also connected to each other via the bridge assisted bit line 1044 to further reduce the series resistance of the assist bits 1014, 1020, 1026, and 1032 and thereby, further reduce the impedance associated with each of the assist bits 1014, 1020, 1026, and 1032. Thus, in the illustrated example, pairs of assist bits (e.g., 1014 and 1026 connected by the local bridge assisted bit line 1040, as well as 1020 and 1032 connected by the bridge assisted bit line 1042) may be formed within columns of the memory array 1002.

The pairs of assist bits (e.g., 1020 and 1030 connected by the local bridge assisted bit line 1040, as well as 1026 and 1036 connected by the bridge assisted bit line 1042) may then be formed by arranging the assist bit columns of adjacent groups 1004, 1006, 1008, and 1010 adjacent to each other (e.g., at opposite ends of the groups 1004, 1006, 1008, and 1010). Therefore, in some implementations, the number of assist bits bridged by the bridge assisted bit lines may equal twice the number of columns within the memory array 1002 resulting in assist bits that have a much lower impedance than the other bit cells of the memory array regardless of the value stored on the bit cell.

Figure 11:
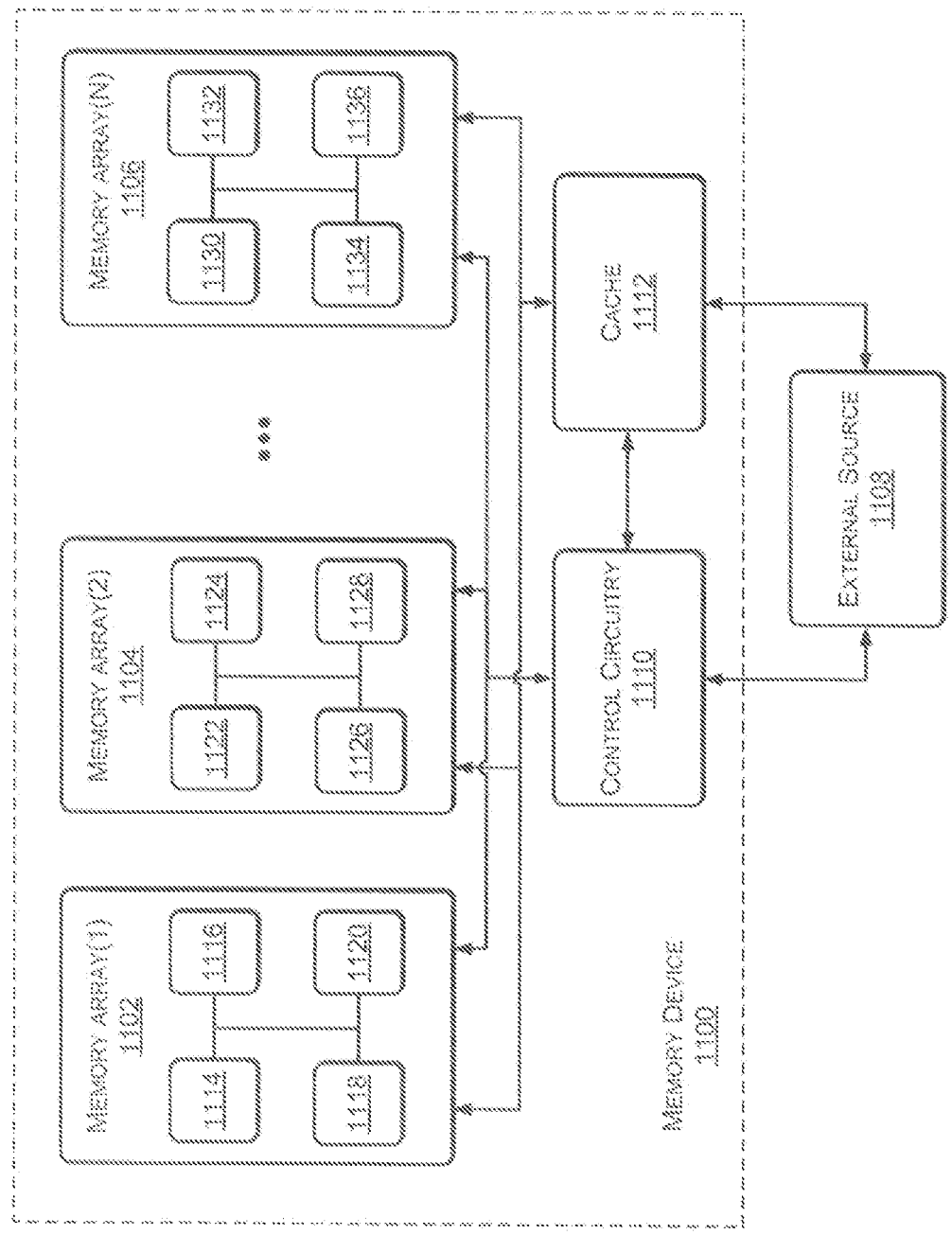
FIG. 11 illustrates select components of a memory device including memory arrays having groups of memory cells each sharing a local source line according to some implementations.

FIG. 11 illustrates select components of a memory device 1100 including memory arrays 1102, 1104, and 1106 having groups of memory cells each sharing a local source line according to some implementations. In some examples, the memory device 1100 may include removable and/or non-removable media implemented in various types of technology for storage of information such as computer-readable instructions or modules, data structures, program modules or other data. Such computer-readable media may include, but is not limited to, RAM, ROM, EEPROM, flash memory or other computer-readable media technology, solid state storage, RAID storage systems, storage arrays, network attached storage, storage area networks, cloud storage, or any other medium that may be used to store information. In some particular implementations, the non-volatile memory array may include elements of magnetic memories or magnetic random access memories (MRAMs), such as magnetic memory cells or magnetic disk storage.

In general, the memory device 1100 may be an example of tangible non-transitory computer storage media and may include both temporary or volatile memory arrays and permanent or non-volatile memory arrays. In the illustrated example, the memory device 1100 includes memory arrays (1)-(N), generally indicated by reference numbers 1102-1106. However, it should be understood that the memory device 1100 may include an alternative number of memory arrays depending on the architecture and/or intended use of the memory device 1100 or an electronic device incorporating the memory device 1100.

In the illustrated example, an external source 1108 is configured to issue commands for accessing data stored in the memory arrays(1)-(N) 1102-1106 to control circuitry 1110. For example, the external source 1108 may send one or more precharge commands, read commands, write commands, and/or activate commands to the control circuitry 1110 in order to read data stored in the memory device 1100 and/or write data to the memory device 1100. In general, the control circuitry 1110 may route the commands issued by the external source 1108 to the corresponding memory array(1)-(N) 1102-1106 in order to cause data stored in the corresponding memory array(1)-(N) 1102-1106 to be loaded into a cache or other temporary storage 1112 that is accessible to the external source 1108.

The memory arrays(1)-(N) 1102-1106 each include memory cells arranged in rows and columns. In some instances, the memory cells are grouped and configured to share a local source line, as described above. For instance, the memory array(1) 1102 includes groups of memory cells 1114, 1116, 1118, and 1120, the memory array(2) 1104 includes groups of memory cells 1122, 1124, 1126, and 1128, and the Nth memory array(N) 1106 includes groups of memory cells 1130, 1132, 1134, and 1136. In the illustrated example, the group of memory cells 1114 of the memory array(1) includes at least one assist bit that has been connected to at least one assist bit associated with each of the other groups 1116-1120 of the memory array(1) via a bridge assisted bit line.

Likewise, the groups of memory cell 1122 includes at least one assist and that has been connected to at least one assist bits associated with each of the groups of the memory 1124-1128 via a bridge assisted bit line and the groups of memory cell 1130 includes at least one assist bit that has been connected to at least one assist bits associated with each of the other groups 1132-1136 of the memory array(1) 1102 via a bridge assisted bit line. As discussed above, the assist bits and the bridge assist bit lines associated with each group of memory cells 1114-1136 of the memory arrays(1)-(N) 1102-1106 allow larger than proportional shares of current distributed along the local source line to be passed through the assist bit, thereby reducing the likelihood of introducing error to the memory device 1100 by inadvertently causing one of the non-active memory cells on the local source line from being switched or set.

Although the subject matter has been described in language specific to structural features, it is to be understood that the subject matter defined in the appended claims is not necessarily limited to the specific features described. Rather, the specific features are disclosed as illustrative forms of implementing the claims.

What is claimed is:

1. A memory array associated with a memory device, the memory array comprising:
    a set of memory cells including a plurality of bit cells and an assist bit, wherein each of the plurality of bit cells is configured to store a value and has an impedance above an impedance threshold, and wherein the assist bit has an impedance below the impedance threshold;
    a local source line coupled to each of the plurality of bit cells and to the assist bit; and
    a plurality of bit lines, wherein one bit line of the plurality of bits lines is associated with each of the plurality of bit cells, and wherein each bit line of the plurality of bit lines is configured to drive a voltage over the associated bit cell to change the value stored in the associated bit cell.

2. The memory array as recited in claim 1, wherein when the voltage is driven over a selected one of the plurality of bit cells, a current associated with the voltage is distributed between the unselected bit cells of the plurality of bit cells and the assist bit by the local source line based at least in part on the impedance associated with each of the unselected bit cells of the plurality of bit cells and the assist bit.

3. The memory array as recited in claim 1, wherein each bit cell of the plurality of bit cells includes a tunnel junction and wherein the assist bit includes a tunnel junction.

4. The memory array as recited in claim 3, wherein the tunnel junction associated with the assist bit has been shorted to cause the impedance of the assist bit to drop below the impedance threshold.

5. The memory array as recited in claim 1, further comprising:
    a second set of memory cells including a second plurality of bit cells for storing and a second assist bit, wherein each of the second plurality of bit cells is configured to store a value and has an impedance above the impedance threshold, and the second assist bit has an impedance below the impedance threshold;
    a second local source line coupled to each of the second plurality of bit cells and to the second assist bit; and
    a second plurality of bit lines, wherein one bit line of the second plurality of bits lines associated with each of the second plurality of bit cells, and wherein each bit line of the second plurality of bit lines is configured to drive a second voltage over the associated bit cell to change the value stored in the associated bit cell.

6. The memory array as recited in claim 5, wherein when the second voltage is driven over a selected one of the second plurality of bit cells, a current associated with the second voltage is distributed between the unselected bit cells of the second plurality of bit cells and the second assist bit by the second local source line based at least in part on the impedance associated with each of the unselected bit cells of the second plurality of bit cells and the second assist bit.

7. The memory array as recited in claim 5, wherein the first assist bit and the second assist bit are connected by a bridge assisted bit line.

8. The memory array as recited in claim 5, wherein each of the first plurality of bit cells, the first assist bit, each of the second plurality of bit cells, and the second assist bit are electrically coupled to a word line.

9. The memory array as recited in claim 5, wherein each of the first plurality of bit cells and the first assist bit are electrically coupled to a first word line and wherein each of the second plurality of bit cells and the second assist bit are electrically coupled to a second word line.

10. The memory array as recited in claim 5, wherein the first plurality of bit lines and the second plurality of bit lines are a same plurality of bit lines.

11. A memory array associated with a memory device, the memory array comprising:
 a first set of memory cells electrically coupled to a first local source line and including a first plurality of bit cells and a first assist bit, the first assist bit including a first shorted tunnel junction; and
 a second set of memory cells electrically coupled to a second local source line and including a second plurality of bit cells and a second assist bit, the second assist bit including a second shorted tunnel junction.

12. The memory array as recited in claim 11, wherein the first shorted tunnel junction associated with the first assist bit is electrically connected to the second shorted tunnel junction associated with the second assist bit by a bridge assisted bit line.

13. The memory array as recited in claim 11, wherein the first shorted tunnel junction associated with the first assist bit and the second shorted tunnel junction associated with the second assist bit are magnetic tunnel junctions.

14. The memory array as recited in claim 11, wherein the first assist bit and the second assist bit are arranged within a same column of the memory array.

15. The memory array as recited in claim 11, wherein the first assist bit and the second assist bit are arranged within a same row of the memory array.

16. The memory array associated with a memory device, the memory array comprising:
 a first set of memory cells coupled to a first local source line and including a first plurality of bit cells and a first assist bit, wherein each of the first plurality of bit cells and the first assist bit includes a tunnel junction;
 a second set of memory cells coupled to a second local source line and including a second plurality of bit cells and a second assist bit, wherein each of the second plurality of bit cells and the second assist bit includes a tunnel junction; and
 wherein the tunnel junction of the first assist bit and the tunnel junction of the second assist bit are electrically connected by a bridge assisted bit line.

17. The memory array as recited in claim 16, wherein the tunnel junction of the first assist bit and the tunnel junction of the second assist bit are shorted.

18. The memory array as recited in claim 16, wherein the first set of memory cells and the second set of memory cells are associated with a shared word line.

19. The memory array as recited in claim 16, wherein the first set of memory cells are associated with a first word line and the second set of memory cells are associated with a second word line.

20. The memory array as recited in claim 16, further comprising:
 a third set of memory cells coupled to a third local source line and including a third plurality of bit cells and a third assist bit, wherein each of the third plurality of bit cells and the third assist bit includes a tunnel junction; and
 a fourth set of memory cells coupled to a fourth local source line and including a fourth plurality of bit cells and a fourth assist bit, wherein each of the fourth plurality of bit cells and the fourth assist bit includes a tunnel junction; and
 wherein the tunnel junction of the third assist bit and the tunnel junction of the fourth assist bit are electrically connected by a second bridge assisted bit line and wherein the first bridge assisted bit line and the second bridge assisted bit line are electrically connected by a third bridge assisted bit line.

* * * * *